(12) United States Patent
Domino

(10) Patent No.: US 11,824,274 B2
(45) Date of Patent: *Nov. 21, 2023

(54) PHASE SHIFTERS FOR COMMUNICATION SYSTEMS

(71) Applicant: Skyworks Solutions, Inc., Irvine, CA (US)

(72) Inventor: William J. Domino, Yorba Linda, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/687,336

(22) Filed: Mar. 4, 2022

(65) Prior Publication Data

US 2022/0302586 A1 Sep. 22, 2022

Related U.S. Application Data

(63) Continuation of application No. 16/667,209, filed on Oct. 29, 2019, now Pat. No. 11,296,410.

(60) Provisional application No. 62/767,709, filed on Nov. 15, 2018.

(51) Int. Cl.
| | |
|---|---|
| *H01Q 3/36* | (2006.01) |
| *H01Q 1/24* | (2006.01) |
| *H03F 3/195* | (2006.01) |
| *H03H 7/20* | (2006.01) |

(52) U.S. Cl.
CPC ............. *H01Q 3/36* (2013.01); *H01Q 1/246* (2013.01); *H03F 3/195* (2013.01); *H03H 7/20* (2013.01)

(58) Field of Classification Search
CPC .............. H01Q 3/26–40; H03H 7/18–20
See application file for complete search history.

(56) References Cited

U.S. PATENT DOCUMENTS 4,028,710 A * 6/1977 Evans ............... H01Q 3/34
342/372
4,359,740 A * 11/1982 Frazita ............... H01P 1/185
343/703

(Continued)

FOREIGN PATENT DOCUMENTS

| JP | 2008-193309 | 8/2008 |
|---|---|---|
| KR | 10-1865612 | 6/2018 |

(Continued)

OTHER PUBLICATIONS

International Search Reoprt and Written Opinion for PCT/US2019/059895, dated Feb. 25, 2020.

(Continued)

*Primary Examiner* — Gennadiy Tsvey
(74) *Attorney, Agent, or Firm* — Knobbe, Martens, Olson & Bear, LLP

(57) ABSTRACT

Phase shifters for communication systems are provided herein. In certain embodiments, a phase shifter includes a plurality of phase shifting sections and a plurality of selection switches each coupled to a corresponding one of the phase shifting sections. The selection switches are formed on a semiconductor die, and are operable to connect one or more selected phase shifting sections between an input terminal and an output terminal, thereby controlling an overall phase shift provided by the phase shifter.

18 Claims, 10 Drawing Sheets

(56) References Cited

U.S. PATENT DOCUMENTS

| | | | | |
|---|---|---|---|---|
| 4,635,062 A * | 1/1987 | Bierig | H01Q 3/36 | 342/372 |
| 4,649,393 A * | 3/1987 | Rittenbach | H01Q 3/38 | 333/139 |
| 4,682,128 A * | 7/1987 | Sproul | H03H 7/20 | 333/156 |
| 4,733,203 A * | 3/1988 | Ayasli | H03H 7/20 | 333/132 |
| 4,733,208 A | 3/1988 | Ishikawa et al. | | |
| 4,994,773 A * | 2/1991 | Chen | H03H 11/20 | 330/277 |
| 5,424,696 A * | 6/1995 | Nakahara | H01P 1/185 | 333/156 |
| 5,519,349 A * | 5/1996 | Nakahara | H03H 11/20 | 327/554 |
| 5,701,107 A * | 12/1997 | Kasahara | H03H 7/20 | 333/139 |
| 6,191,735 B1 | 2/2001 | Schineller | | |
| 6,320,481 B1 * | 11/2001 | Sharma | H01P 1/18 | 333/159 |
| 6,504,505 B1 * | 1/2003 | Yung | H01Q 3/26 | 342/374 |
| 6,674,341 B2 * | 1/2004 | Hieda | H03H 11/20 | 333/139 |
| 6,806,792 B2 * | 10/2004 | Penn | H01P 1/185 | 333/139 |
| 6,850,130 B1 | 2/2005 | Gottl et al. | | |
| 7,126,442 B2 * | 10/2006 | Nakajima | H03H 7/20 | 333/156 |
| 7,173,503 B1 | 2/2007 | Cadotte, Jr. | | |
| 7,239,218 B2 * | 7/2007 | Nakamura | H03H 7/20 | 333/139 |
| 7,355,492 B2 * | 4/2008 | Hyman | H03H 17/08 | 333/140 |
| 9,780,448 B1 * | 10/2017 | Meagher | H01P 1/184 | |
| 9,831,857 B2 * | 11/2017 | Facchini | H03F 1/0288 | |
| 10,476,157 B1 * | 11/2019 | Segoria | H03H 7/20 | |
| 10,587,240 B2 | 3/2020 | Cook | H03H 7/20 | |
| 2003/0222691 A1 * | 12/2003 | Dueme | H03H 7/20 | 327/231 |
| 2004/0145429 A1 * | 7/2004 | Hieda | H03H 11/18 | 333/164 |
| 2005/0242993 A1 | 11/2005 | Hein | | |
| 2006/0038634 A1 * | 2/2006 | Kirino | H01Q 21/0006 | 333/164 |
| 2006/0079275 A1 | 4/2006 | Ella et al. | | |
| 2006/0109066 A1 | 5/2006 | Borysenko | | |
| 2007/0013460 A1 * | 1/2007 | Buer | H03H 11/20 | 333/164 |
| 2008/0180189 A1 * | 7/2008 | Miya | H01P 1/18 | 333/103 |
| 2008/0186108 A1 | 8/2008 | Miya | | |
| 2008/0205551 A1 | 8/2008 | Lo et al. | | |
| 2009/0015347 A1 * | 1/2009 | Prikhodko | H01P 1/15 | 455/295 |
| 2009/0015508 A1 | 1/2009 | Prikhodko et al. | | |
| 2009/0051464 A1 * | 2/2009 | Atsumo | H03H 11/16 | 333/139 |
| 2009/0251234 A1 * | 10/2009 | Hirama | H03H 9/545 | 333/169 |
| 2012/0105299 A1 * | 5/2012 | Goettl | H01Q 21/22 | 333/161 |
| 2014/0139373 A1 * | 5/2014 | Tseng | H01Q 3/385 | 342/374 |
| 2015/0207486 A1 * | 7/2015 | Ehyaie | H01Q 3/38 | 375/257 |
| 2015/0288411 A1 | 10/2015 | Zhan et al. | | |
| 2016/0112226 A1 * | 4/2016 | Martinez | H03C 3/12 | 455/110 |
| 2016/0301121 A1 * | 10/2016 | Dandlberger | H01P 5/028 | |
| 2017/0063404 A1 | 3/2017 | Langer et al. | | |
| 2017/0187086 A1 * | 6/2017 | Koul | H01P 1/184 | |
| 2017/0230028 A1 | 8/2017 | Gamal El Din et al. | | |
| 2017/0230033 A1 | 8/2017 | Shapiro et al. | | |
| 2018/0198204 A1 | 7/2018 | Kovacic | | |
| 2018/0205358 A1 | 7/2018 | Onaka et al. | | |
| 2019/0081693 A1 | 3/2019 | Eitan et al. | | |
| 2019/0140622 A1 * | 5/2019 | Birkbeck | H03H 17/0009 | |
| 2020/0161760 A1 | 5/2020 | Domino | | |
| 2020/0161761 A1 | 5/2020 | Domino | | |

FOREIGN PATENT DOCUMENTS

| | | |
|---|---|---|
| WO | WO 2020/101949 | 5/2020 |
| WO | WO 2020/101952 | 5/2020 |

OTHER PUBLICATIONS

International Search Reoprt and Written Opinion for PCT/US2019/059867, dated Feb. 25, 2020.

International Preliminary Report on Patentability for PCT/US2019/059867, dated May 18, 2021.

Gallagher, "Understanding phase shift in analog circuits", located at https://www.allaboutcircuits.com/technical-articles/understanding-phase-shift-in-analog-circuits/ (2019).

* cited by examiner

PHASE SHIFTERS FOR COMMUNICATION SYSTEMS

INCORPORATION BY REFERENCE TO ANY PRIORITY APPLICATIONS

Any and all applications, if any, for which a foreign or domestic priority claim is identified in the Application Data Sheet of the present application are hereby incorporated by reference under 37 CFR 1.57.

BACKGROUND

Technical Field

Embodiments of the invention relate to electronic systems, and in particular, to radio frequency (RF) electronics.

Description of the Related Technology

Phase shifters are used in RF communication systems to control the phase of RF signals transmitted or received wirelessly via antennas.

Examples of RF communication systems that can include one or more phase shifters include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for certain communications standards.

SUMMARY

In certain embodiments, the present disclosure relates to a phase shifter for a communication system. The phase shifter includes an input terminal configured to receive a radio frequency input signal, an output terminal configured to provide a radio frequency output signal having a phase shift with respect to the radio frequency input signal, a plurality of phase shifting sections, and a plurality of selection switches formed on a semiconductor die and each coupled to a corresponding one of the plurality of phase shifting sections. The plurality of selection switches are operable to connect one or more selected phase shifting sections chosen from the plurality of phase shifting sections between the input terminal and the output terminal to thereby control the phase shift.

In various embodiments, each of the plurality of phase shifting sections provides a different amount of phase shift to the radio frequency input signal. Accordingly to a number of embodiments, the plurality of phase shifting sections are binary weighted.

In several embodiments, the phase shifter further includes a plurality of isolation switches configured to decouple at least one unselected phase shifting section of the plurality of phase shifting sections from a radio frequency signal path connecting the input terminal to the output terminal through the one or more selected phase shifting sections. In accordance with some embodiments, the phase shifter further includes a plurality of shunt switches configured to electrically connect the at least one unselected phase shifting section to a reference voltage.

In various embodiments, the plurality of selection switches are configured to cascade the one or more selected phase shifting sections between the input terminal and the output terminal when at least two phase shifting sections are selected.

In some embodiments, the plurality of phase shifting sections includes a plurality of transmission lines. According to a number of embodiments, the plurality of transmission lines are implemented as a plurality of nested rings.

In several embodiments, the plurality of phase shifting sections includes a plurality of circuit networks. According to a number of embodiments, the plurality of circuit networks include a plurality of inductor-capacitor networks.

In various embodiments, the phase shifter further includes a control circuit formed on the semiconductor die and configured to control the plurality of selection switches.

In some embodiments, the control circuit is configured to control the plurality of selection switches based on digital data received over an interface of the semiconductor die.

In several embodiments, the plurality of phase shifting sections are formed on the semiconductor die.

In various embodiments, the plurality of phase shifting sections are formed on a substrate to which the semiconductor die is attached.

In certain embodiments, the present disclosure relates to a wireless device. The wireless device includes an antenna array including a plurality of antenna elements, a plurality of signal conditioning circuits each operatively associated with a corresponding one of the plurality of antenna elements and including a phase shifter, and a transceiver electrically coupled to the plurality of signal conditioning circuits. The phase shifter includes a plurality of phase shifting sections and a plurality of selection switches each coupled to a corresponding one of the plurality of phase shifting sections, the plurality of selection switches formed on a semiconductor die and operable to connect one or more selected phase shifting sections chosen from the plurality of phase shifting sections between an input and an output of the phase shifter.

In some embodiments, each of the plurality of phase shifting sections provides a different amount of phase shift. According to several embodiments, the plurality of phase shifting sections are binary weighted.

In various embodiments, the phase shifter further includes a plurality of isolation switches configured to decouple at least one unselected phase shifting section of the plurality of phase shifting sections from a radio frequency signal path through the phase shifter from the input to the output. According to a number of embodiments, the phase shifter further includes a plurality of shunt switches configured to electrically connect the at least one unselected phase shifting section to a reference voltage.

In several embodiments, the plurality of selection switches are configured to cascade the one or more selected phase shifting sections between the input and the output when at least two phase shifting sections are selected.

In some embodiments, the plurality of phase shifting sections includes a plurality of transmission lines. According to a number of embodiments, the plurality of transmission lines are implemented as a plurality of nested rings.

In various embodiments, the plurality of phase shifting sections includes a plurality of circuit networks. In accordance with several embodiments, the plurality of circuit networks include a plurality of inductor-capacitor networks.

In a number of embodiments, the wireless device further includes a control circuit formed on the semiconductor die and configured to control the plurality of selection switches. According to some embodiments, the control circuit is configured to control the plurality of selection switches based on digital data received over an interface of the semiconductor die.

In several embodiments, the plurality of phase shifting sections are formed on the semiconductor die.

In various embodiments, the plurality of phase shifting sections are formed on a substrate to which the semiconductor die is attached.

In certain embodiments, the present disclosure relates to a method of phase shifting in a communication system. The method includes selecting one or more phase shifting sections from a plurality of phase shifting sections using a plurality of selection switches of a semiconductor die, the plurality of selection switches each coupled to a corresponding one of the plurality of phase shifting sections. The method further includes electrically connecting the one or more selected phase shifting sections between an input terminal and an output terminal using the plurality of selection switches, receiving a radio frequency input signal at the input terminal, and providing a radio frequency output signal at the output terminal with a phase shift relative to the radio frequency input signal, the phase shift based on the one or more selected phase shifting sections.

In a number of embodiments, the method further includes providing a different amount of phase shift with each of the plurality of phase shifting sections.

In several embodiments, the method further includes isolating at least one unselected phase shifting section of the plurality of phase shifting sections from a radio frequency signal path connecting the input terminal to the output terminal. According to various embodiments, the method further includes electrically connecting the at least one unselected phase shifting section to a reference voltage.

In some embodiments, electrically connecting the one or more selected phase shifting sections between the input terminal and the output terminal includes cascading at least two phase shifting sections between the input terminal and the output terminal.

In a number of embodiments, selecting one or more phase shifting sections includes selecting one or more transmission lines.

In various embodiments, selecting one or more phase shifting sections includes selecting one or more circuit networks.

In some embodiments, the method further includes receiving digital data over an interface of the semiconductor die, and controlling the plurality of selection switches based on the digital data.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
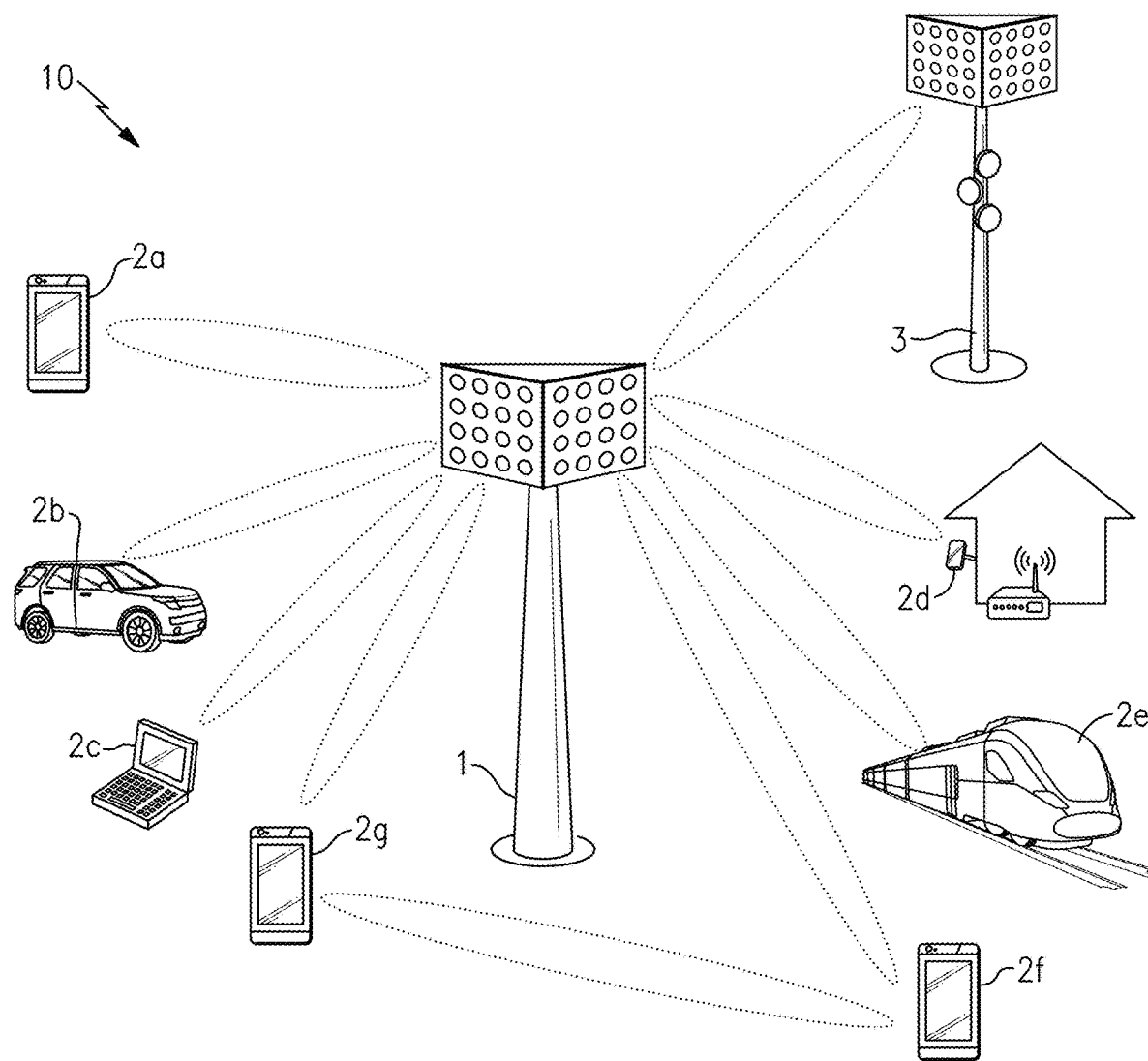
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and plans to introduce Phase 2 of 5G technology in Release 16 (targeted for 2019). Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Phase Shifters for Communication Systems

Antenna arrays can be used to transmit and/or receive radio frequency (RF) signals in base stations, network access points, mobile phones, tablets, customer-premises equipment (CPE), laptops, computers, wearable electronics, and/or other communication devices. For example, communication devices that utilize millimeter wave carriers (for instance, 30 GHz to 300 GHz), centimeter wave carriers (for instance, 3 GHz to 30 GHz), and/or other carrier frequencies can employ an antenna array to provide beam formation and directivity for transmission and/or reception of signals.

In the context of signal transmission, the signals from the antenna elements of the antenna array combine using constructive and destructive interference to generate an aggregate transmit signal exhibiting beam-like qualities with more signal strength propagating in a given direction away from the antenna array. In the context of signal reception, more signal energy is received by the antenna array when the signal is arriving from a particular direction. Accordingly, an antenna array can also provide directivity for reception of signals.

A signal conditioning circuit can be used to condition a transmit signal for transmission via an antenna element of an antenna array and/or to condition a received signal from the antenna element. Such signal conditioning circuits can include a phase shifter for providing controllable phase adjustment to a signal associated with a particular antenna element. The signal conditioning circuits can further include other circuitry, such as a power amplifier for amplifying a signal for transmission and/or a low noise amplifier (LNA) for amplifying a received signal while introducing a relatively small amount of noise.

To provide flexibility for beamforming, it is desirable that available phase adjustment for phase shifting span a wide angular range, for instance, a full 360°. In certain applications, it is also desirable for the phase shifting to have a step size that is substantially uniform.

Phase shifters for communication systems are provided herein. In certain embodiments, a phase shifter includes a plurality of phase shifting sections and a plurality of selection switches each coupled to a corresponding one of the phase shifting sections. The selection switches are formed on a semiconductor die, and are operable to connect one or more selected phase shifting sections between an input terminal and an output terminal, thereby controlling an overall phase shift provided by the phase shifter.

In certain implementations, the selection switches are operable to cascade the selected phase shifting sections between the input terminal and the output terminal. For example, when two or more of the phase shifting sections are chosen, the selected phase shifting sections are arranged in series between the input terminal and the output terminal to achieve the desired amount phase shift.

Thus, the semiconductor die serves as a single switching device for controlling on/off switching functionality for cascading the selected phase shifting sections. The semiconductor die can also include joining paths that join the phase shifting sections to one another and that serve to bypass any unselected phase shifting sections.

The phase shifting sections can be formed in a wide variety of ways. In certain implementations, the phase shifting sections are each formed using a transmission line of a length suitable to provide a particular phase shift for a given phase shifting section. Such transmission lines can be nested to provide a relatively compact area. However, nesting need not be used, for instance, in applications with relaxed area constraints.

Although an example implementation of the phase shifting sections using transmission lines has been described, other implementations are possible. For instance, circuit networks such as inductor-capacitor (LC) networks can serve as phase shifting sections, with values of the inductors and capacitors chosen to achieve a particular phase shift desired for a given phase shifting section.

The phase shifting sections can be implemented on the semiconductor die or off chip. For example, there may be different implementation scenarios, which can be impacted by operating frequency of the phase shifter and/or implementation of the phase shifting sections. In a first example, the phase shifter operates below about 6 GHz, and the phase shifter includes phase shifting sections implemented using printed transmission lines on a substrate of a system board, with the semiconductor die mounted on the board. In a second example, the phase shifter operates above about 6 GHz, and the phase shifter includes phase shifting sections implemented using transmission lines of relatively short length for location on the semiconductor die with the selection switches or for location on a module substrate to which the semiconductor die is attached.

In certain implementations, at least a portion of the phase shifting sections are implemented to provide different amounts of phase shifting from one another. For example, the phase shifting sections can be implemented with binary weighting to provide a wide phase shifting range using a relatively few number of phase shifting sections. For instance, to span 360° in 64 substantially uniform step sizes of about 5.625° each, six selectable phase shifting sections having phase delays of about 180°, 90°, 45°, 22.5°, 11.25°, and 5.625° can be included.

Although an example with binary weighting has been described, the teachings herein are applicable to phase shifting sections using other weighting schemes. Furthermore, although an example with six selectable phase shifting sections has been described, the phase shifters herein can include more or fewer phase shifting sections.

In certain implementations, a control circuit is implemented on the semiconductor die with the selection switches, and serves to generate control signals used for turning on or off the switches to thereby choose a particular selection of the phase shifting sections. Implementing the phase shifter in this manner reduces routing congestion by avoiding a need to route switch control signals around a module and/or system board. In certain implementations, the control circuit receives digital data for controlling the state of the selection switches. For example, the semiconductor die can receive the digital data from a transceiver or radio frequency integrated circuit (RFIC) over an interface or bus.

The amount of phase shift provided by the phase shifter is based on the selected phase shifting sections connected between the input terminal and the output terminal. In certain implementations, the phase shifter further includes isolation switches operable to disconnect any unselected phase shifting sections from the signal path between the input terminal and the output terminal, thereby reducing the impacts of parasitics on the RF signal propagating from the input terminal to the output terminal. For example, each of the phase shifting sections can be positioned between a pair of corresponding series switches used to disconnect the phase shifting section from the RF signal path when the phase shifting section is not in use.

In certain implementations, the phase shifter further includes shunt switches for electrically connecting any unselected phase shifting sections to ground or another suitable reference voltage. Implementing the phase shifter in this manner can provide a number of benefits, including, but not limited to, inhibiting an unselected phase shifting section from inadvertently radiating as an antenna and/or from generating electromagnetic fields that impact signaling performance.

The phase shifters herein can be used for phase shifting signals for beamforming in the context of signal transmission and/or signal reception. Thus, the phase shifters can used in combination with antenna arrays that only transmit signals, with antenna arrays that only receive signals, and with antenna arrays that both transmit signals and receive signals.

Figure 2A:
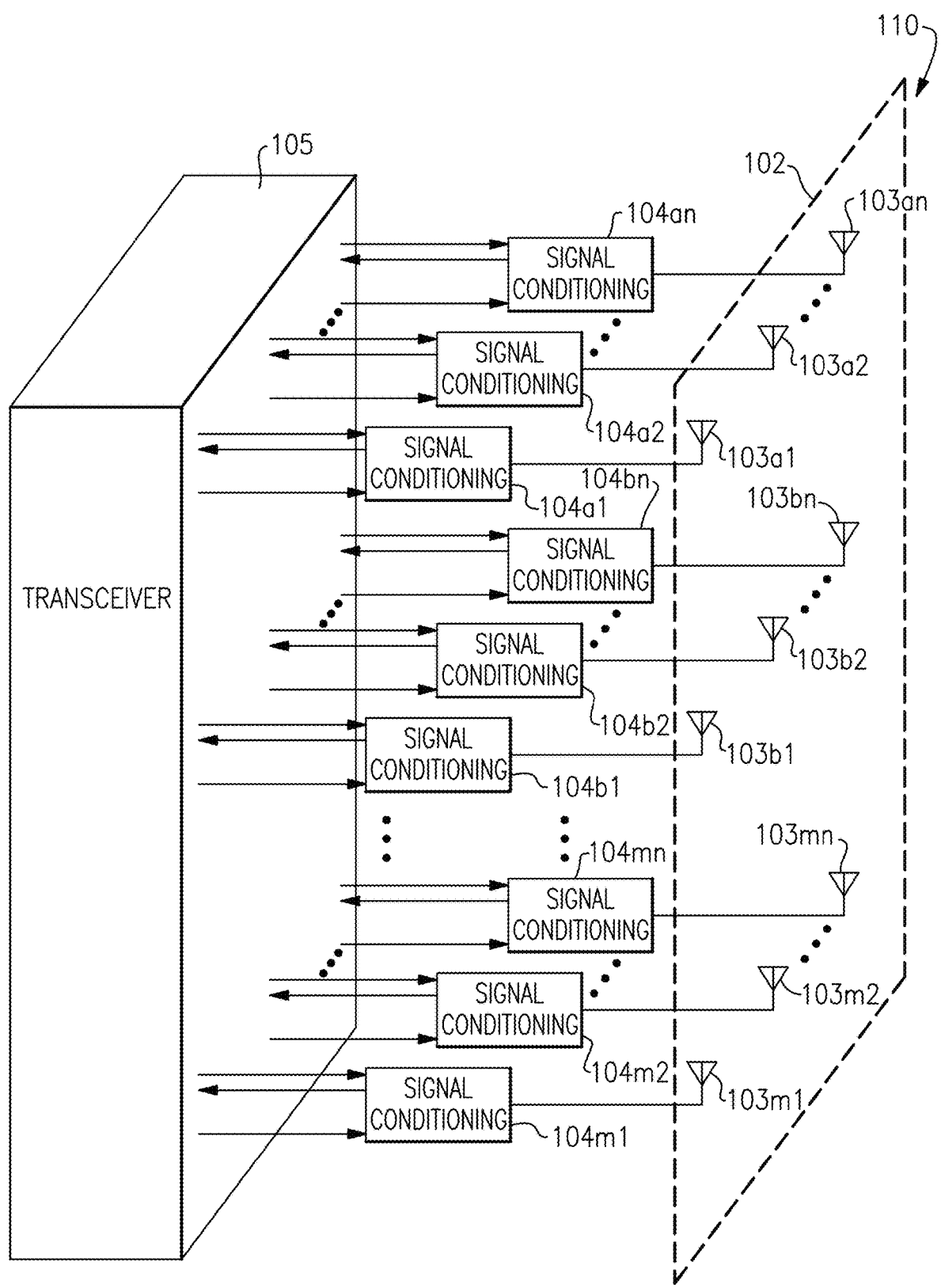
FIG. 2A is a schematic diagram of one embodiment of a communication system that operates with beamforming.

FIG. 2A is a schematic diagram of one embodiment of a communication system 110 that operates with beamforming. The communication system 110 includes a transceiver 105, signal conditioning circuits 104a1, 104a2 . . . 104an, 104b1, 104b2 . . . 104bn, 104m1, 104m2 . . . 104mn, and an antenna array 102 that includes antenna elements 103a1, 103a2 . . . 103an, 103b1, 103b2 . . . 103bn, 103m1, 103m2 . . . 103mn.

Communications systems that communicate using millimeter wave carriers, centimeter wave carriers, and/or other frequency carriers can employ an antenna array such as the antenna array 102 to provide beam formation and directivity for transmission and/or reception of signals.

For example, in the illustrated embodiment, the communication system 110 includes an array 102 of m×n antenna elements, each of which are coupled to a separate signal conditioning circuit, in this embodiment. As indicated by the ellipses, the communication system 110 can be implemented with any suitable number of antenna elements and signal conditioning circuits.

With respect to signal transmission, the signal conditioning circuits 104a1, 104a2 . . . 104an, 104b1, 104b2 . . . 104bn, 104m1, 104m2 . . . 104mn can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits 104a1, 104a2 . . . 104an, 104b1, 104b2 . . . 104bn, 104m1, 104m2 . . . 104mn process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the signal conditioning circuits 104a1, 104a2 . . . 104an, 104b1, 104b2 . . . 104bn, 104m1, 104m2 . . . 104mn and processes signals received from the signal conditioning circuits.

As shown in FIG. 2A, the transceiver 105 generates control signals for the signal conditioning circuits 104a1, 104a2 . . . 104an, 104b1, 104b2 . . . 104bn, 104m1, 104m2 . . . 104mn. The control signals can be used for a variety of functions, such as controlling the gain and phase of transmitted and/or received signals to control beamforming. For example, each of the signal conditioning circuits 104a1, 104a2 . . . 104an, 104b1, 104b2 . . . 104bn, 104m1, 104m2 . . . 104mn can include a phase shifter implemented in accordance with the teachings herein.

Figure 2B:
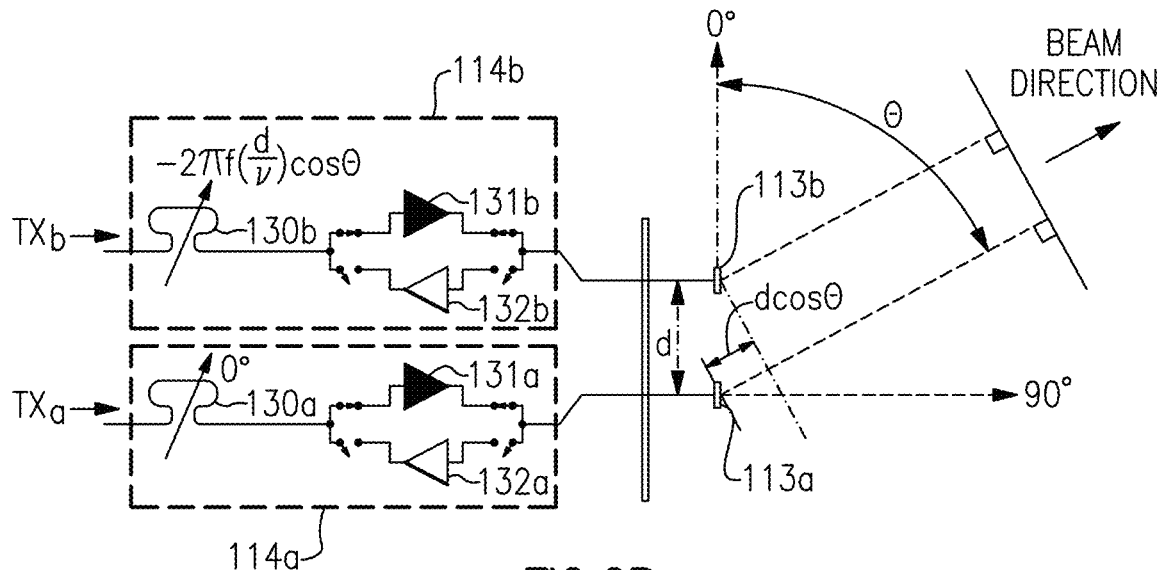
FIG. 2B is a schematic diagram of one embodiment of beamforming to provide a transmit beam.

FIG. 2B is a schematic diagram of one embodiment of beamforming to provide a transmit beam. FIG. 2B illustrates a portion of a communication system including a first signal conditioning circuit 114a, a second signal conditioning circuit 114b, a first antenna element 113a, and a second antenna element 113b.

Although illustrated as included two antenna elements and two signal conditioning circuits, a communication system can include additional antenna elements and/or signal conditioning circuits. For example, FIG. 2B illustrates one embodiment of a portion of the communication system 110 of FIG. 2A.

The first signal conditioning circuit 114a includes a first phase shifter 130a, a first power amplifier 131a, a first low noise amplifier (LNA) 132a, and switches for controlling selection of the power amplifier 131a or LNA 132a. Additionally, the second signal conditioning circuit 114b includes a second phase shifter 130b, a second power amplifier 131b, a second LNA 132b, and switches for controlling selection of the power amplifier 131b or LNA 132b. The first phase shifter 130a and the second phase shifter 130b can be implemented in accordance with any of the embodiments herein.

Although one embodiment of signal conditioning circuits is shown, other implementations of signal conditioning circuits are possible. For instance, in one example, a signal conditioning circuit includes one or more band filters, duplexers, diplexers, and/or other components.

In the illustrated embodiment, the first antenna element 113a and the second antenna element 113b are separated by a distance d. Additionally, FIG. 2B has been annotated with an angle θ, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113a, 113b, a desired transmit beam angle θ can be achieved. For example, when the first phase shifter 130a has a reference value of 0°, the second phase shifter 130b can be controlled to provide a phase shift of about $-2\pi f(d/v)\cos\theta$ radians, where f is the fundamental frequency of the transmit signal, d is the distance between the antenna elements, v is the velocity of the radiated wave, and $\pi$ is the mathematic constant pi.

In certain implementations, the distance d is implemented to be about $\frac{1}{2}\lambda$, where $\lambda$ is the wavelength of the fundamental component of the transmit signal. In such implementations, the second phase shifter 130b can be controlled to provide a phase shift of about $-\pi\cos\theta$ radians to achieve a transmit beam angle $\theta$.

Accordingly, the relative phase of the phase shifters 130a, 130b can be controlled to provide transmit beamforming. In certain implementations, a transceiver (for example, the transceiver 105 of FIG. 2A) controls phase values of one or more phase shifters to control beamforming.

Figure 2C:
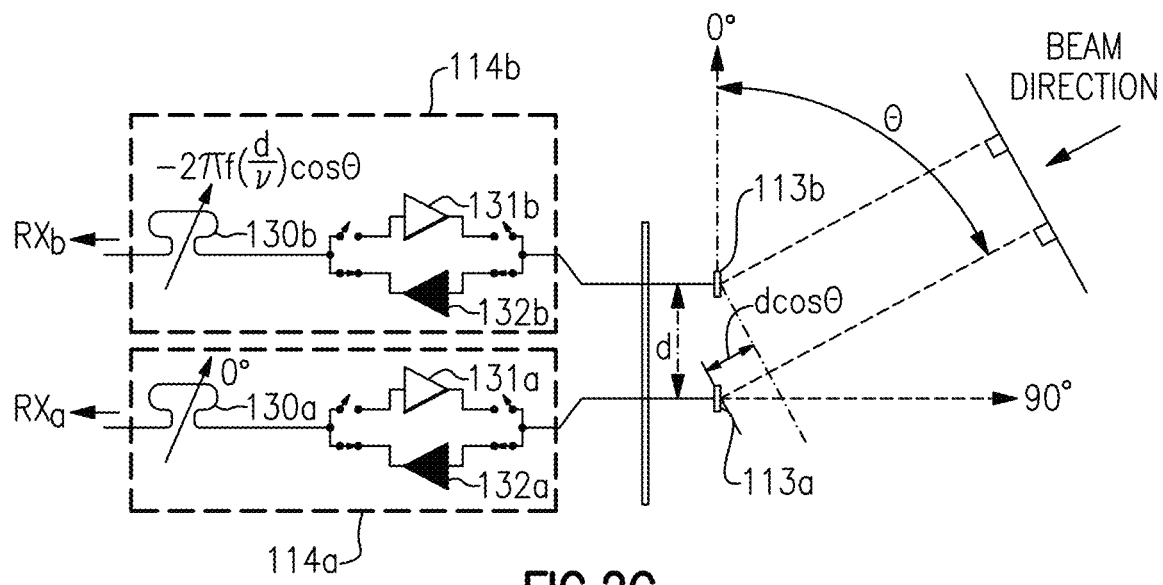
FIG. 2C is a schematic diagram of one embodiment of beamforming to provide a receive beam.

FIG. 2C is a schematic diagram of one embodiment of beamforming to provide a receive beam. FIG. 2C is similar to FIG. 2B, except that FIG. 2C illustrates beamforming in the context of a receive beam rather than a transmit beam.

As shown in FIG. 2C, a relative phase difference between the first phase shifter 130a and the second phase shifter 130b can be selected to about equal to $-2\pi f(d/v)\cos\theta$ radians to achieve a desired receive beam angle $\theta$. In implementations in which the distance d corresponds to about $\frac{1}{2}\lambda$, the phase difference can be selected to about equal to $-\pi\cos\theta$ radians to achieve a receive beam angle $\theta$.

Although various equations for phase values to provide beamforming have been provided, other phase selection values are possible, such as phase values selected based on implementation of an antenna array, implementation of signal conditioning circuits, and/or a radio environment.

Figure 3:
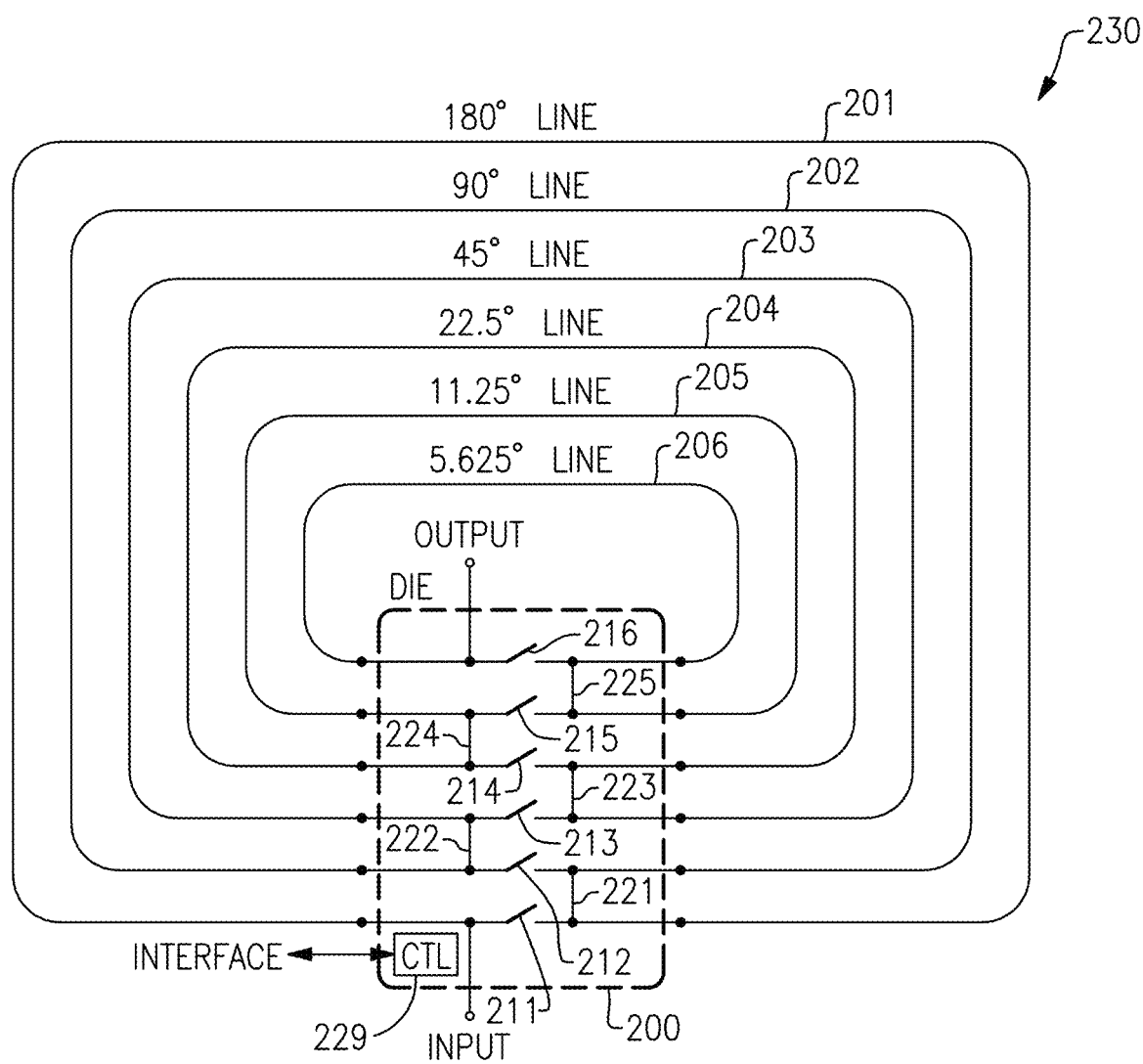
FIG. 3 is a schematic diagram of a phase shifter according to one embodiment.

FIG. 3 is a schematic diagram of a phase shifter 230 according to one embodiment. The phase shifter 230 includes phase shifting sections 201-206, selection switches 211-216, and joining paths 221-225. The phase shifter 230 further includes an input terminal (INPUT) for receiving an RF input signal and an output terminal (OUTPUT) for outputting an RF output signal having a desired phase shift with respect to the RF input signal.

In the illustrated embodiment, the selection switches 211-216 and the joining paths 221-225 are formed on a semiconductor die 200, while the phase shifting sections 201-206 are formed off chip, for instance, on a module substrate or system board. However, other implementations are possible, including, for example, implementations in which the phase shifting sections 201-206 are formed on the semiconductor die 200.

With continuing reference to FIG. 3, the phase shifting sections 201-206 include a first phase shifting section 201, a second phase shifting section 202, a third phase shifting section 203, a fourth phase shifting section 204, a fifth phase shifting section 205, and a sixth phase shifting section 206. Although an example with six phase shifting sections is depicted, a phase shifter can include more or fewer phase shifting sections.

The phase shifting sections 201-206 are implemented as transmission lines, in this embodiment. Additionally, the transmission lines have lengths to achieve particular phase shifts, which vary from section to section.

In the illustrated embodiment, the transmission lines have lengths that are binary weighted. For example, the first phase shifting section 201 provides a phase shift of about 180°, the second phase shifting section 202 provides a phase shift of about 90°, the third phase shifting section 203 provides a phase shift of about 45°, the fourth phase shifting section 204 provides a phase shift of about 22.5°, the fifth phase shifting section 205 provides a phase shift of about 11.25°, and the sixth phase shifting section 206 provides a phase shift of about 5.625°.

Implementing the phase shifter 230 in this manner provides an angular phase span of 360° in 64 substantially uniform step sizes of about 5.625° each. In FIG. 3, the lengths of the phase shifting sections 201-206 to achieve the indicated phase shifts are not drawn to scale.

Although one embodiment of phase shifting values for phase shifting sections has been provided, other implementations are possible. For example, phase shifting sections need not be implemented with binary weights, but rather can have phase values implemented in accordance with any suitable weighting scheme. Additionally or alternatively, more or fewer phase shifting sections can be included to achieve a desired granularity for phase adjustment.

As shown in FIG. 3, each of the phase shifting sections 201-206 is implemented in a ring that is selectively broken or unbroken by a corresponding one of the selection switches 211-216. Thus, the selection switches 211-216 can be selectively opened or closed to select a particular combination of the phase shifting sections 201-206 for inclusion between the input terminal and the output terminal.

In the illustrated embodiment, the transmission line rings used to implement the phase shifting sections 201-206 are concentric, thereby providing a compact layout. However, other implementations are possible.

As shown in FIG. 3, the semiconductor die 200 also includes the joining paths 221-225 for joining the phase shifting sections 201-206 and for bypassing a particular phase shifting section when unselected. For example, the first joining path 221 connects the first phase shifting section 201 to the second phase shifting section 202, the second joining path 222 connects the second phase shifting section 202 to the third phase shifting section 203, the third joining path 223 connects the third phase shifting section 203 to the fourth phase shifting section 204, the fourth joining path 224 connects the fourth phase shifting section 204 to the fifth phase shifting section 205, and the fifth joining path 225 connects the fifth phase shifting section 205 to the sixth phase shifting section 206.

The phase shifting sections 201-206 operate in combination with the joining paths 221-225 to route the RF signal from the input terminal to the output terminal along a path that provides the desired phase shift.

For example, to provide the lowest or smallest amount of phase shift, each of the selection switches 211-216 is closed. Additionally, the RF input signal received on the input terminal propagates through the first selection switch 211, the first joining path 221, the second selection switch 212, the second joining path 222, the third selection switch 213, the third joining path 223, the fourth selection switch 214, the fourth joining path 224, the fifth selection switch 215, the fifth joining path 225, and the sixth selection switch 216 to reach the output terminal.

Thus, each of the selection switches 211-216 can be closed to achieve the lowest amount of phase shift provided by the phase shifter 230 between the input terminal and the output terminal.

With continuing reference to FIG. 3, one or more of the selection switches 211-216 can be opened to increase the overall amount of phase shift by an amount corresponding to the phase shift of the phase shifting sections 201-206, respectively.

For example, when the first selection switch 211 is opened, the RF input signal from the input terminal is routed through the first phase shifting section 201 before reaching the first joining path 221. Since the first phase shifting section 201 provides about 180° of phase shift, in this example, opening the first selection switch 211 increases the overall amount of phase shift by about 180°. Similarly, in this example, opening the second selection switch 212 increases the phase shift by about 90°, opening the third selection switch 213 increases the phase shift by about 45°, opening the fourth selection switch 214 increases the phase shift by about 22.5°, opening the fifth selection switch 215 increases the phase shift by about 11.25°, and opening the sixth selection switch 216 increases the phase shift by about 5.625°.

Furthermore, when two or more of the selection switches 211-216 are opened, the corresponding selected phase shifting sections are cascaded between the input terminal and the output terminal. Accordingly, any combination of the phase shifting sections 201-206 can be selected to achieve a desired overall phase shift. For example, the phase shifts contributed from each selected phase shifting section add to achieve the overall phase shift.

In certain implementations, the semiconductor die 200 includes a control circuit 229 for controlling the state of the selection switches 211-216. The control circuit serves to generate control signals used for turning on or off the selection switches 211-216 to thereby choose a particular selection of the phase shifting sections 201-206.

Implementing the phase shifter 230 in this manner reduces routing congestion by avoiding a need to route switch control signals around a module and/or system board. In certain implementations, the control circuit receives digital data for controlling the state of the selection switches. For example, the semiconductor die 200 can receive the digital data from a transceiver or RFIC over an interface.

To enhance integration, the semiconductor die 200 can further include additional circuitry, including, but not limited to, front end circuitry. Thus, the selection switches 211-216 can be implemented on-chip with a wide range of other circuitry of a communication system to thereby provide a compact and/or low cost solution.

Figure 4:
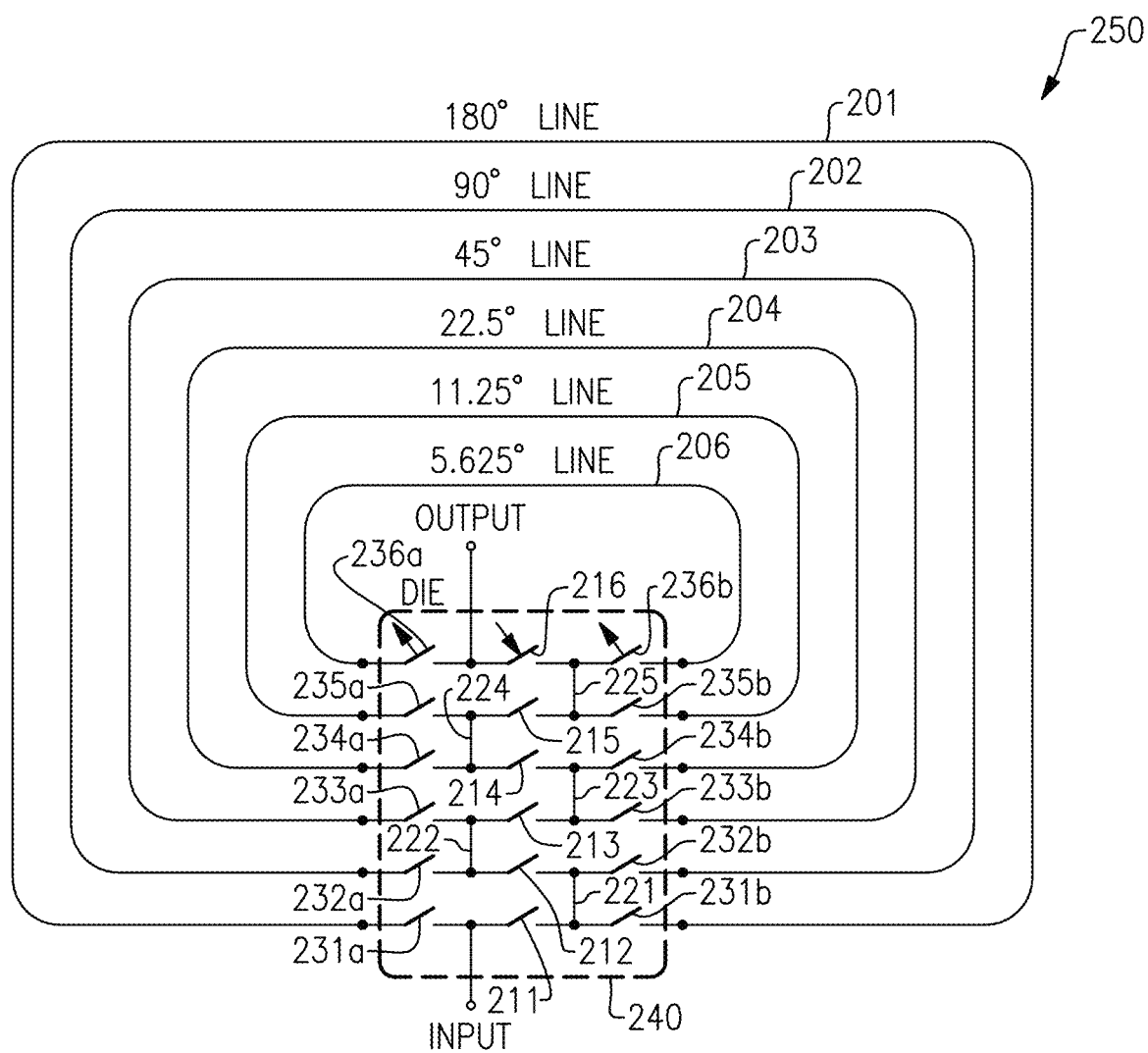
FIG. 4 is a schematic diagram of a phase shifter according to another embodiment.

FIG. 4 is a schematic diagram of a phase shifter 250 according to another embodiment. The phase shifter 250 of FIG. 4 is similar to the phase shifter 230 of FIG. 3, except that the phase shifter 250 includes a semiconductor die 240 that further includes isolation switches for decoupling unselected phase shifting sections from the RF signal path between input terminal and the output terminal.

For example, as shown in FIG. 4, the semiconductor die 240 includes a first pair of isolation switches 231a-231b for the first phase shifting section 201, a second pair of isolation switches 232a-232b for the second phase shifting section 202, a third pair of isolation switches 233a-233b for the third phase shifting section 203, a fourth pair of isolation switches 234a-234b for the fourth phase shifting section 204, a fifth pair of isolation switches 235a-235b for the fifth phase shifting section 205, and sixth pair of isolation switches 236a-236b for the sixth phase shifting section 206.

With continuing reference to FIG. 4, as indicated by the arrows, when selecting a particular phase shifting section, the corresponding selection switch is opened while the corresponding pair of isolation switches is closed. For example, when selecting the first phase shifting section 201, the first selection switch 211 is opened and each of the pair of isolation switches 231a-231b is closed. Additionally, when a particular phase shifting section is not selected, the corresponding selection switch is closed while the corresponding pair of isolation switches is opened. For example, the first selection switch 211 can be closed and each of the pair of isolation switches 231a-231b opened to unselect the first phase shifting section 201.

Including isolation switches reduces the impacts of parasitics on the RF signal propagating from the input terminal to the output terminal. For example, each pair of isolation switches disconnects a corresponding phase shifting section from the RF signal path when the phase shifting section is not in use, thereby decoupling the RF signal path from parasitics (parasitic resistance, parasitic inductance, and/or parasitic capacitance) of the phase shifting section.

Figure 5:
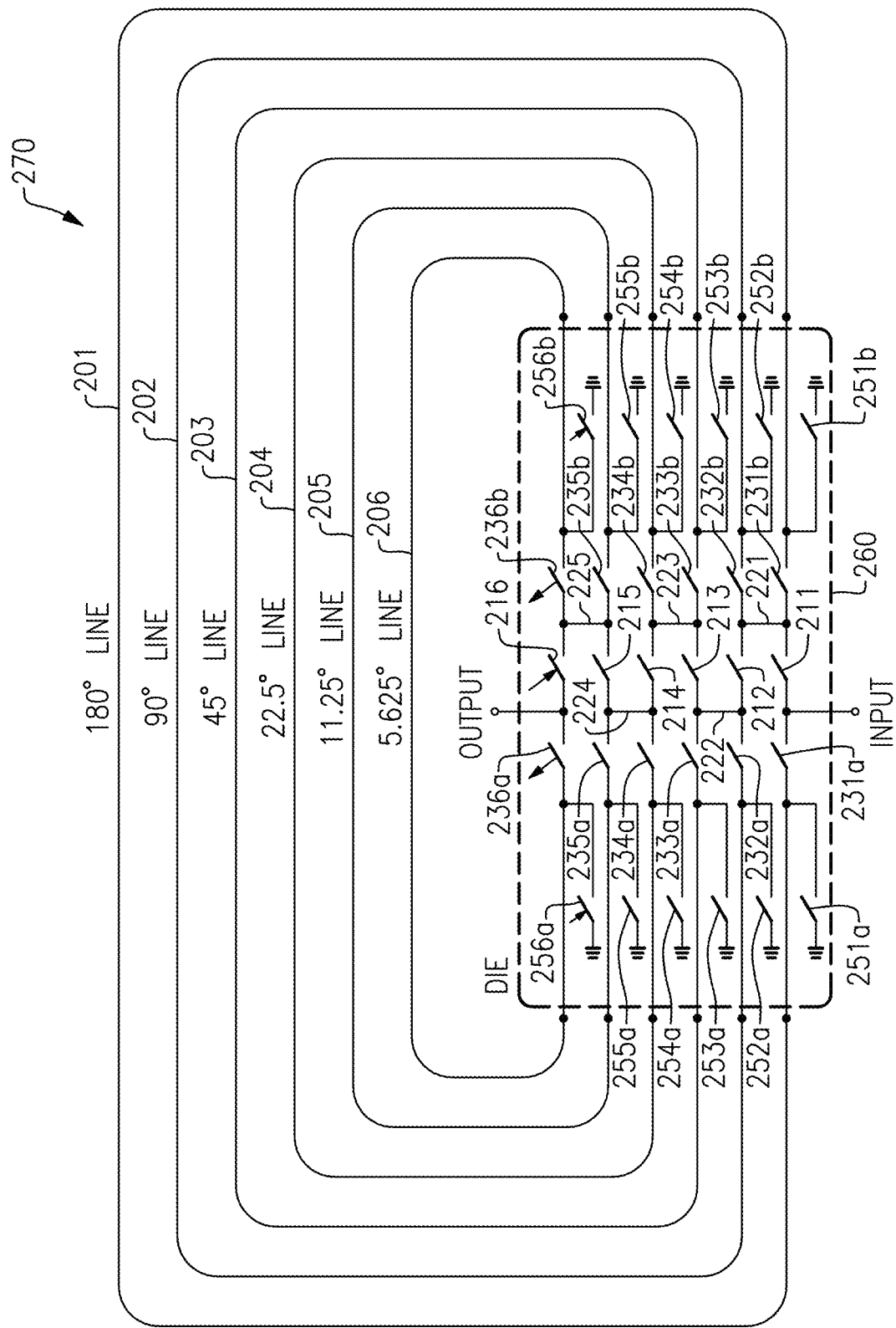
FIG. 5 is a schematic diagram of a phase shifter according to another embodiment.

FIG. 5 is a schematic diagram of a phase shifter 270 according to another embodiment. The phase shifter 270 of FIG. 5 is similar to the phase shifter 250 of FIG. 4, except that the phase shifter 270 includes a semiconductor die 260 that further includes shunt switches for controlling the voltage of unselected phase shifting sections.

For example, as shown in FIG. 5, the semiconductor die 260 includes a first pair of shunt switches 251a-251b for the first phase shifting section 201, a second pair of shunt switches 252a-252b for the second phase shifting section 202, a third pair of shunt switches 253a-253b for the third phase shifting section 203, a fourth pair of shunt switches 254a-254b for the fourth phase shifting section 204, a fifth pair of shunt switches 235a-235b for the fifth phase shifting section 205, and sixth pair of shunt switches 236a-236b for the sixth phase shifting section 206. In this example, each pair of shunt switches selectively connects a corresponding phase shifting section to ground.

With continuing reference to FIG. 5, as indicated by the arrows, when selecting a particular phase shifting section, the corresponding selection switch is opened while the corresponding pair of isolation switches is also opened. For example, when selecting the first phase shifting section 201, the first selection switch 211 is opened and each of the pair of shunt switches 251a-251b is also opened. Additionally, when a particular phase shifting section is not selected, the corresponding selection switch is closed while the corresponding pair of isolation switches is also closed. For example, the first selection switch 211 can be closed and each of the pair of shunt switches 251a-251b closed when the first phase shifting section 201 is unselected.

Implementing a phase shifter with shunt switches for electrically connecting unselected phase shifting sections to ground or another suitable reference voltage provides a number of advantages. For example, implementing the phase shifter in this manner inhibits an unselected phase shifting section from inadvertently radiating as an antenna and/or from generating electromagnetic fields.

Figure 6:
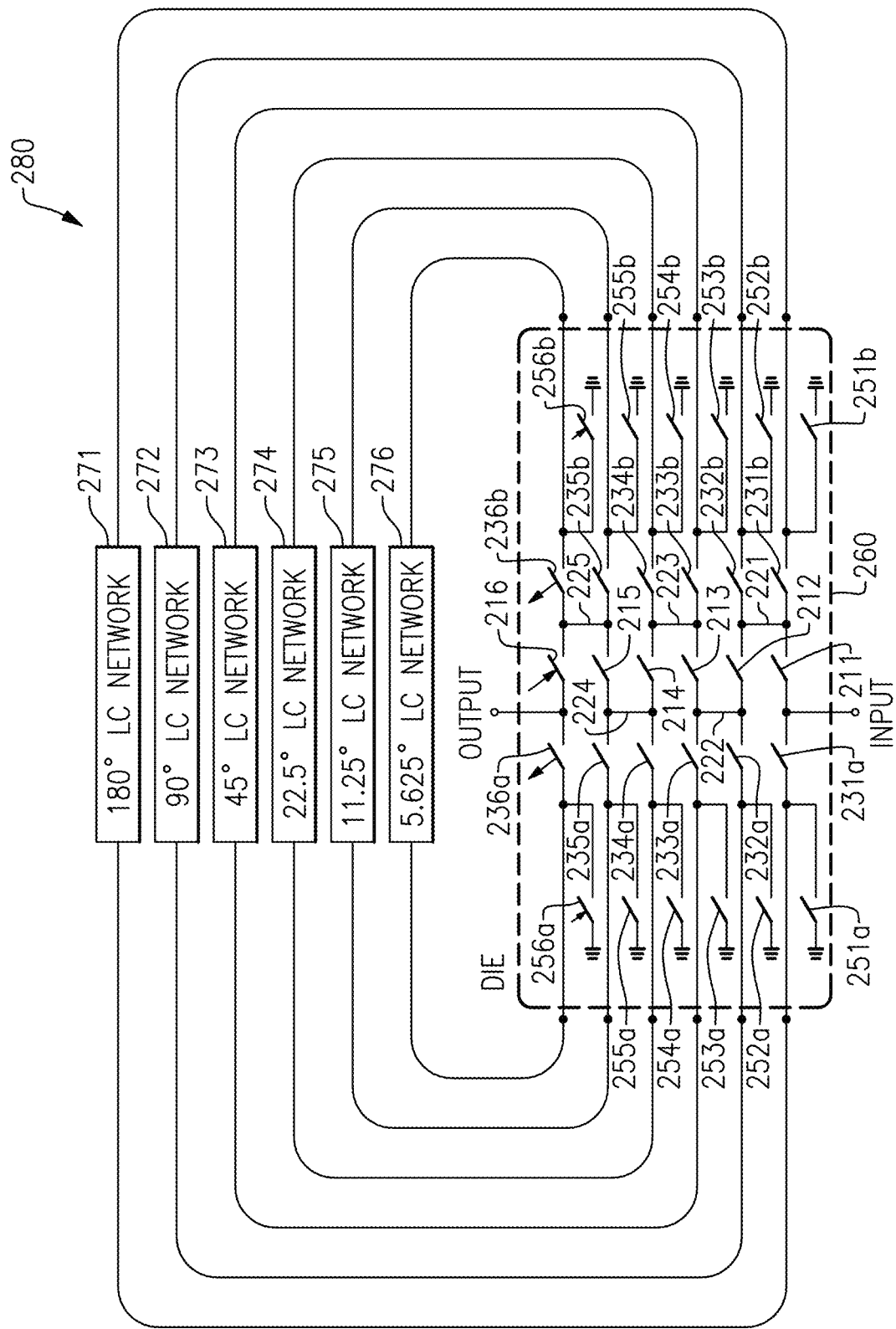
FIG. 6 is a schematic diagram of a phase shifter according to another embodiment.

FIG. 6 is a schematic diagram of a phase shifter 280 according to another embodiment. The phase shifter 280 of FIG. 6 is similar to the phase shifter 270 of FIG. 5, except that the phase shifter 280 of FIG. 6 includes a different implementation of phase shifting sections.

For example, the phase shifter 280 includes first to sixth phase shifting circuit networks 271-276, respectively. The phase shifting circuit networks 271-276 each include circuit elements, such as resistors, capacitors, and/or inductors selected to achieve the desired phase shift. For example, the phase shifting circuit networks 271-276 can be implemented as inductor-capacitor (LC) networks with values of the inductors and capacitors chosen to achieve a particular phase shift for a given phase shifting section.

Figure 7:
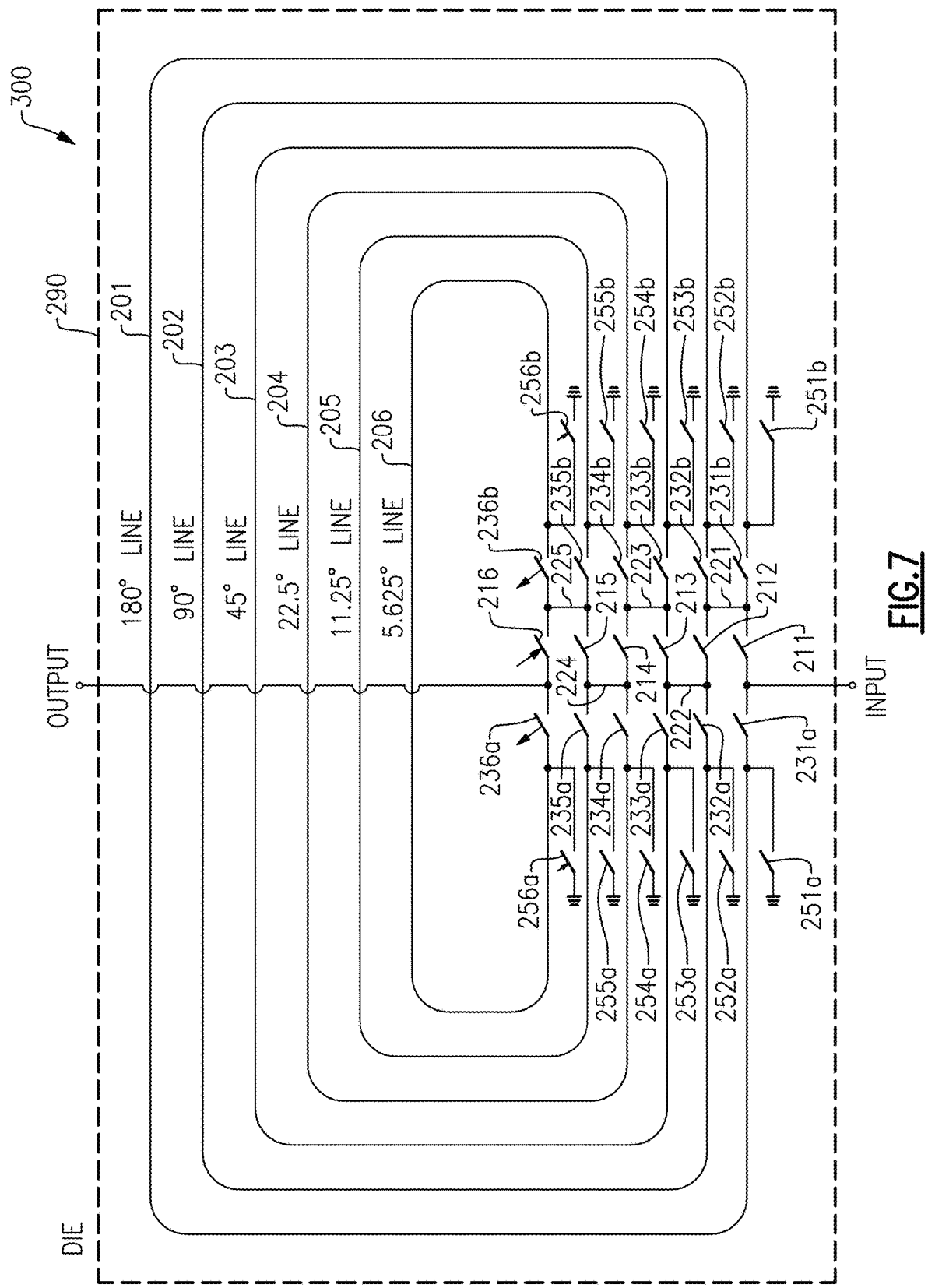
FIG. 7 is a schematic diagram of a phase shifter according to another embodiment.

FIG. 7 is a schematic diagram of a phase shifter 300 according to another embodiment. The phase shifter 300 of FIG. 7 is similar to the phase shifter 270 of FIG. 5, except that the phase shifter 300 includes a semiconductor die 290 in which the phase shifting sections 201-206 are implemented thereon. Thus, the phase shifting sections 201-206 are implemented on-chip with the switches, in this embodiment.

The phase shifters herein can include phase shifting sections implemented on the semiconductor die or off chip. For example, there may be different implementation scenarios, which can be impacted by operating frequency of the phase shifter and/or implementation of the phase shifting sections. In a first example, the phase shifter operates below about 6 GHz, and the phase shifter includes phase shifting sections implemented using printed transmission lines on a substrate of a system board, with the semiconductor die mounted on the board. In a second example, the phase shifter operates above about 6 GHz, and the phase shifter includes phase shifting sections implemented using transmission lines of relatively short length for location on the semiconductor die with the selection switches or for location on a module substrate to which the semiconductor die is attached.

Figure 8:
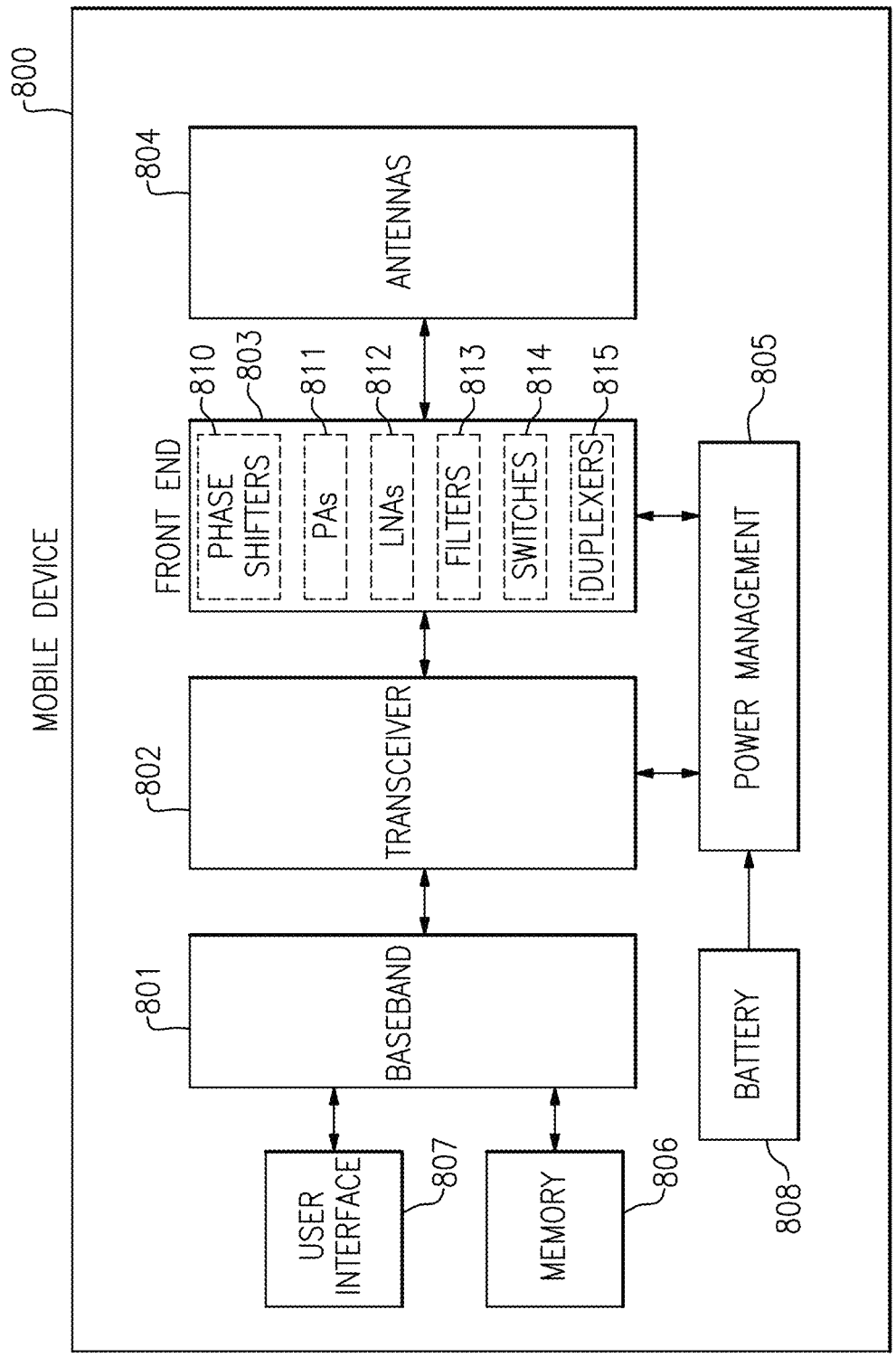
FIG. 8 is a schematic diagram of one embodiment of a mobile device.

FIG. 8 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 8 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes phase shifters 810, power amplifiers (PAs) 811, low noise amplifiers (LNAs) 812, filters 813, switches 814, and duplexers 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

The mobile device 800 operates with beamforming. For example, the front end system 803 includes phase shifters 810 having variable phase controlled by the transceiver 802. In certain implementations, the transceiver 802 controls the phase of the phase shifters 810 based on data received from the processor 801.

The phase shifters 810 are controlled to provide beam formation and directivity for transmission and/or reception of signals using the antennas 804. For example, in the context of signal transmission, the phases of the transmit signals provided to an antenna array used for transmission are controlled such that radiated signals combine using constructive and destructive interference to generate an aggregate transmit signal exhibiting beam-like qualities with more signal strength propagating in a given direction. In the context of signal reception, the phases are controlled such that more signal energy is received when the signal is arriving to the antenna array from a particular direction.

The phase shifters 810 can be implemented in accordance with any of the embodiments herein. Although FIG. 8 illustrates one example of a mobile device that can include phase shifters implemented in accordance with the teachings herein, the phase shifters herein can be used in communication systems implemented in a wide variety of ways. Accordingly, other implementations are possible.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 8, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 8, the power management system 805 receives a battery voltage from the battery 808. The battery 808 can be any suitable battery for use in the mobile device 800, including, for example, a lithium-ion battery.

Figure 9:
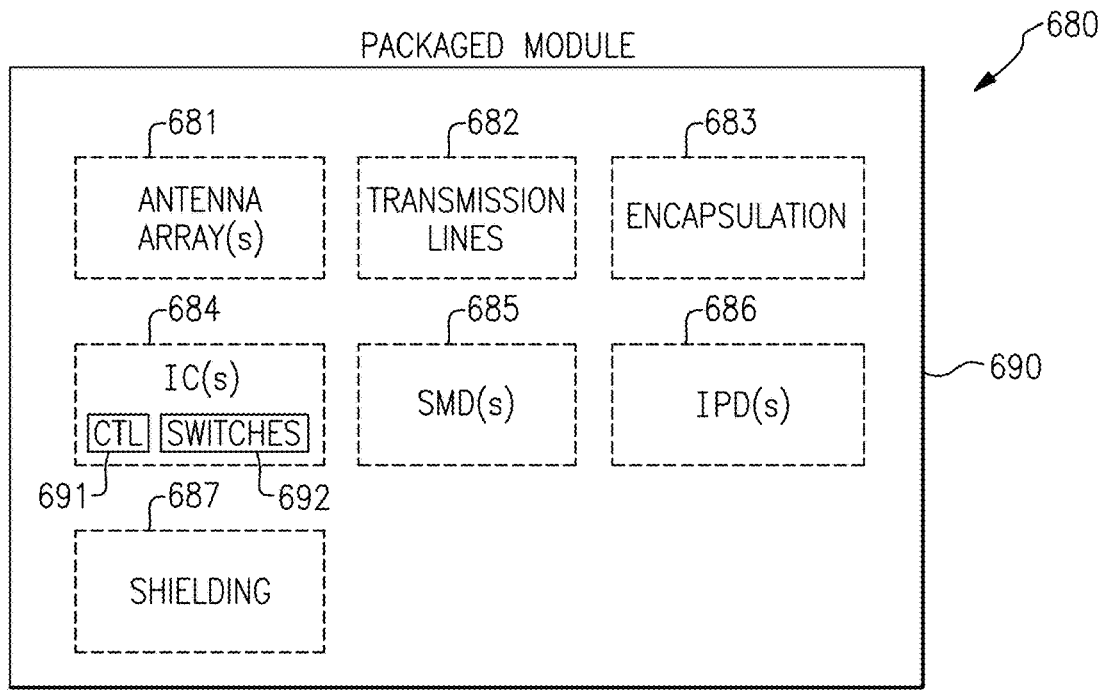
FIG. 9 is a plan view of one embodiment of a module.

FIG. 9 is a plan view of one embodiment of a module 680. The module 680 includes a substrate 690 as well as various structures formed on and/or attached to the substrate 690. For example, the module 680 includes antenna array(s) 681, phase shifting transmission lines 682, encapsulation 683, IC(s) 684 (including a control circuit 691 and switches 692, in this embodiment), surface mount device(s) or SMD(s) 685, integrated passive device(s) or IPD(s) 686, and shielding 687. The module 680 illustrates various examples of components and structures that can be included in a module of a communication device that includes one or more phase shifters implemented in accordance with the teachings herein.

Although one example of a combination of components and structures is shown, a module can include more or fewer components and/or structures.

Figure 10A:
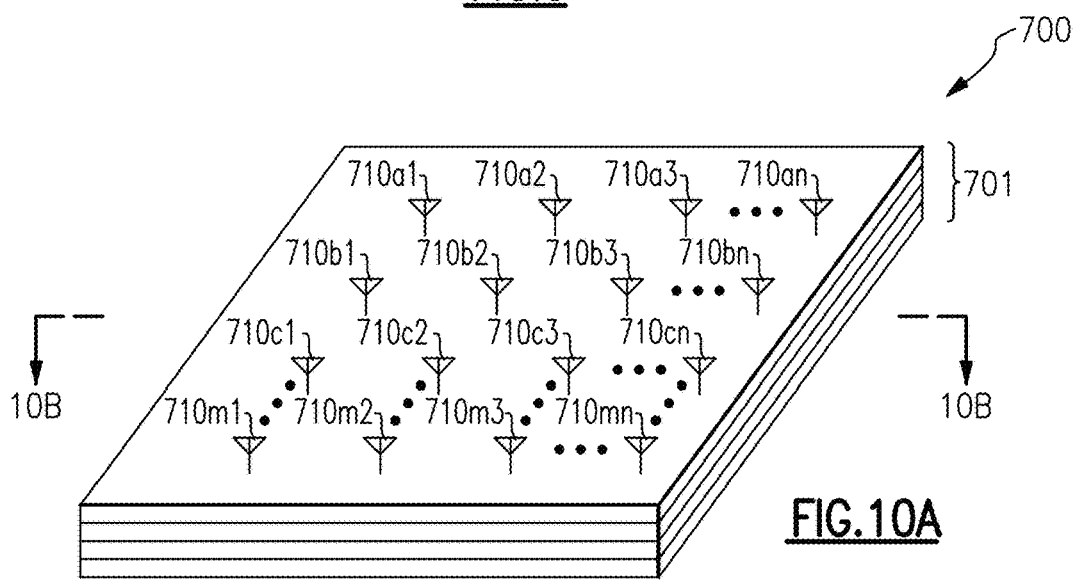
FIG. 10A is a perspective view of another embodiment of a module.
Figure 10B:
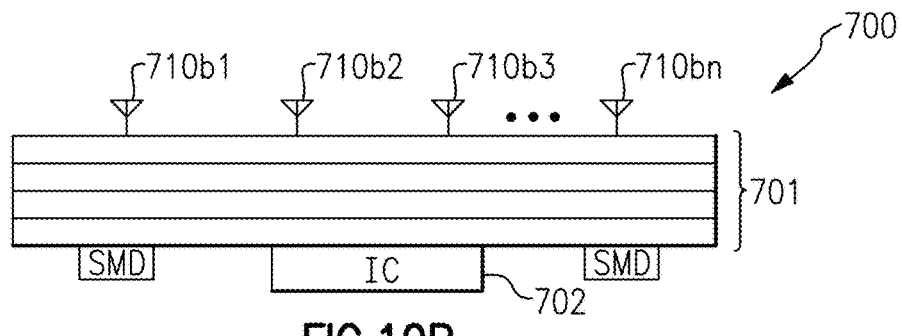
FIG. 10B is a cross-section of the module of FIG. 10A taken along the lines 10B-10B.

FIG. 10A is a perspective view of another embodiment of a module 700. FIG. 10B is a cross-section of the module 700 of FIG. 10A taken along the lines 10B-10B.

The module 700 includes a laminated substrate or laminate 701, a semiconductor die or IC 702 (not visible in FIG. 10A), SMDs (not visible in FIG. 10A), and an antenna array including antenna elements $710a1, 710a2, 710a3 \ldots 710an, 710b1, 710b2, 710b3 \ldots 710bn, 710c1, 710c2, 710c3 \ldots 710cn, 710m1, 710m2, 710m3 \ldots 710mn$.

Although not shown in FIGS. 10A and 10B, the module 700 can include additional structures and components that have been omitted from the figures for clarity. Moreover, the module 700 can be modified or adapted in a wide variety of ways as desired for a particular application and/or implementation.

The antenna elements antenna elements $710a1, 710a2, 710a3 \ldots 710an, 710b1, 710b2, 710b3 \ldots 710bn, 710c1, 710c2, 710c3 \ldots 710cn, 710m1, 710m2, 710m3 \ldots 710mn$ are formed on a first surface of the laminate 701, and can be used to receive and/or transmit signals, based on implementation. Although a 4×4 array of antenna elements is shown, more or fewer antenna elements are possible as indicated by ellipses. Moreover, antenna elements can be arrayed in other patterns or configurations, including, for instance, arrays using non-uniform arrangements of antenna elements. Furthermore, in another embodiment, multiple antenna arrays are provided, such as separate antenna arrays for transmit and receive.

In the illustrated embodiment, the IC 702 is on a second surface of the laminate 701 opposite the first surface. However, other implementations are possible. In one example, the IC 702 is integrated internally to the laminate 701.

In certain implementations, the IC 702 includes signal conditioning circuits associated with the antenna elements $710a1, 710a2, 710a3 \ldots 710an, 710b1, 710b2, 710b3 \ldots 710bn, 710c1, 710c2, 710c3 \ldots 710cn, 710m1, 710m2, 710m3 \ldots 710mn$ and that include phase shifters implemented in accordance with the teachings herein. Although an implementation with one semiconductor chip is shown, the teachings herein are applicable to implementations with additional chips.

The laminate 701 can include various structures including, for example, conductive layers, dielectric layers, and/or solder masks. The number of layers, layer thicknesses, and materials used to form the layers can be selected based on a wide variety of factors, and can vary with application and/or implementation. The laminate 701 can include vias for providing electrical connections to signal feeds and/or ground feeds of the antenna elements. For example, in certain implementations, vias can aid in providing electrical connections between signal conditioning circuits of the IC 702 and corresponding antenna elements.

The antenna elements $710a1, 710a2, 710a3 \ldots 710an, 710b1, 710b2, 710b3 \ldots 710bn, 710c1, 710c2, 710c3 \ldots 710cn, 710m1, 710m2, 710m3 \ldots 710mn$ can correspond to antenna elements implemented in a wide variety of ways. In one example, the array of antenna elements includes patch antenna element formed from a patterned conductive layer on the first side of the laminate 701, with a ground plane formed using a conductive layer on opposing side of the laminate 701 or internal to the laminate 701. Other examples of antenna elements include, but are not limited to, dipole antenna elements, ceramic resonators, stamped metal antennas, and/or laser direct structuring antennas.

APPLICATIONS

The principles and advantages of the embodiments described herein can be used for a wide variety of applications.

For example, phase shifters can be included in various electronic devices, including, but not limited to consumer electronic products, parts of the consumer electronic products, electronic test equipment, etc. Example electronic devices include, but are not limited to, a base station, a wireless network access point, a mobile phone (for instance, a smartphone), a tablet, a television, a computer monitor, a computer, a hand-held computer, a personal digital assistant (PDA), a microwave, a refrigerator, an automobile, a stereo system, a disc player, a digital camera, a portable memory chip, a washer, a dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A phase shifter for a communication system, the phase shifter comprising:
   a plurality of concentric rings connected to a plurality of selection switches, each concentric ring having at least one phase shifting section, each concentric ring selectively broken or unbroken by a corresponding selection switch; and
   a plurality of joining paths formed on a semiconductor die, each joining path connecting a larger concentric ring in series with a smaller concentric ring, each concentric ring having at least a first joining path, a first selection switch, a first pair of isolation switches that are operable in a first state to direct a signal to bypass a first phase shifting section and propagate through the first joining path, and operable in a second state to direct the signal to propagate through the first phase shifting section and the first joining path to thereby control phase shift in the signal.

2. The phase shifter of claim 1 wherein the first phase shifting section provides a different amount of phase shift to the signal that a second phase shifting section.

3. The phase shifter of claim 2 wherein phase shifting sections in the plurality of concentric rings are binary weighted.

4. The phase shifter of claim 1 wherein each pair of isolation switches open to decouple a corresponding phase shifting section from a radio frequency signal path connecting an input terminal to an output.

5. The phase shifter of claim 1 wherein the plurality of concentric rings are formed on the semiconductor die.

6. The phase shifter of claim 1 wherein the plurality of selection switches are configured to cascade selected phase shifting sections between an input terminal and an output terminal when at least two phase shifting sections are selected.

7. The phase shifter of claim 1 wherein first phase shifting section has a first transmission line that provides a different phase shift than a second transmission line associated with a second phase shifting section.

8. The phase shifter of claim 7 wherein lengths of the first and second transmission lines determine phase shift amounts.

9. The phase shifter of claim 1 wherein phase shifting sections of the plurality of concentric rings include a plurality of circuit networks.

10. The phase shifter of claim 9 wherein the plurality of circuit networks include a plurality of inductor-capacitor networks.

11. The phase shifter of claim 1 wherein the plurality of concentric rings are formed on a substrate to which the semiconductor die is attached.

12. A wireless device comprising:
   an antenna array including a plurality of antenna elements mounted on a first side of a laminate;
   a plurality of signal conditioning circuits mounted on a second side of a laminate, each operatively associated with a corresponding one of the plurality of antenna elements and including a phase shifter, the phase shifter including a plurality of concentric rings and a plurality of selection switches, each concentric ring having at least one phase shifting section, each concentric ring selectively broken or unbroken by a corresponding selection switch;
   a plurality of joining paths formed on a semiconductor die, each joining path connecting a larger concentric ring in series with a smaller concentric ring, each concentric ring having at least a first joining path, a first selection switch, and a first pair of isolation switches that are operable in a first state to direct a signal to bypass a first phase shifting section and propagate through the first joining path, and operable in a second state to direct the signal through the first phase shifting section and the first joining path; and
   a transceiver electrically coupled to the plurality of signal conditioning circuits.

13. The wireless device of claim 12 wherein the phase shifter further includes a plurality of isolation switches, at least a pair of isolation switches couple to each phase shifting section, each pair of isolation switches configured to decouple a corresponding concentric phase shifting section from a radio frequency signal path through the phase shifter from an input to an output.

14. The wireless device of claim 12 wherein the plurality of concentric rings are formed on the semiconductor die.

15. The wireless device of claim 12 wherein the plurality of selection switches are configured to cascade selected concentric rings between an input and an output when at least two phase shifting sections are selected.

16. The wireless device of claim 12 wherein a first phase shifting section has a transmission line that is longer than a second transmission line.

17. A method of phase shifting in a communication system, the method comprising:
- selecting one or more concentric rings from a plurality concentric rings, each concentric ring having at least one phase shifting section, and each concentric ring selectively broken or unbroken by a corresponding selection switch;
- electrically connecting a plurality of joining paths formed on a semiconductor die, each joining path connecting a larger concentric ring in series with a smaller concentric ring, each concentric ring having at least a first selection switch, and a first pair of isolation switches that are operable in a first state to direct a signal to bypass a first phase shifting section and propagate through a first joining path, and operable in a second state to direct the signal through the first phase shifting section and the first joining path;
- receiving a radio frequency input signal at an input terminal; and
- providing a radio frequency output signal at an output terminal with a phase shift relative to the radio frequency input signal, the phase shift based on selecting the one or more concentric rings.

18. The method of claim 17 further comprising isolating at least one phase shifting section of an unselected concentric ring from a radio frequency signal path connecting the input terminal to the output terminal.

\* \* \* \* \*